(12) United States Patent
Filippov et al.

(10) Patent No.: US 11,922,103 B2
(45) Date of Patent: Mar. 5, 2024

(54) ALGORITHM FOR OPTIMAL ICD CONFIGURATION USING A COUPLED WELLBORE-RESERVOIR MODEL

(71) Applicant: Landmark Graphics Corporation, Houston, TX (US)

(72) Inventors: Andrey Filippov, Houston, TX (US); Vitaly Khoriakov, Calgary (CA)

(73) Assignee: Landmark Graphics Corporation, Houston, TX (US)

( * ) Notice: Subject to any disclaimer, the term of this patent is extended or adjusted under 35 U.S.C. 154(b) by 176 days.

(21) Appl. No.: 17/134,090

(22) Filed: Dec. 24, 2020

(65) Prior Publication Data

US 2021/0115763 A1    Apr. 22, 2021

Related U.S. Application Data

(62) Division of application No. 14/890,581, filed as application No. PCT/US2013/053263 on Aug. 1, 2013, now Pat. No. 10,907,449.

(51) Int. Cl.
*E21B 41/00* (2006.01)
*E21B 43/12* (2006.01)
(Continued)

(52) U.S. Cl.
CPC .............. *G06F 30/28* (2020.01); *E21B 41/00* (2013.01); *E21B 43/12* (2013.01); *G06F 17/10* (2013.01)

(58) Field of Classification Search
CPC .......... E21B 41/00; E21B 43/12; E21B 47/00; G06G 17/10
See application file for complete search history.

(56) References Cited

U.S. PATENT DOCUMENTS

| 6,112,817 A * | 9/2000 | Voll ........................ E21B 34/08 166/373 |
| 7,469,743 B2 | 12/2008 | Richards |

(Continued)

FOREIGN PATENT DOCUMENTS

GB         2356879 A  *  6/2001  ............. E21B 43/08

OTHER PUBLICATIONS

Coronado et al., "New Inflow Control Device Reduces Fluid Viscosity Sensitivity and Maintains Erosion Resistance," OTC 19811 (2009).*

(Continued)

*Primary Examiner* — Jay C Kim
(74) *Attorney, Agent, or Firm* — Kilpatrick Townsend & Stockton LLP (57) ABSTRACT

The disclosed embodiments include a method, apparatus, and computer program product for improving production of an oil well. For example, one disclosed embodiment includes a system that includes at least one processor and at least one memory coupled to the at least one processor and storing instructions that when executed by the at least one processor performs operations for generating a model of a wellbore in a wellbore simulator. The at least one processor further executes an algorithm that determines optimal parameters for inflow control devices (ICD) along a horizontal portion of the wellbore. The determined optimal parameters of the inflow control devices would yield a substantially uniform approach of at least one of water and gas along the horizontal portion of the wellbore.

12 Claims, 6 Drawing Sheets

(51) Int. Cl.
  *G06F 17/10* (2006.01)
  *G06F 30/28* (2020.01)

(56) References Cited

U.S. PATENT DOCUMENTS

| | | | |
|---|---|---|---|
| 7,789,145 | B2 | 9/2010 | Patel |
| 7,802,621 | B2 | 9/2010 | Riichards et al. |
| 8,025,072 | B2 | 9/2011 | Atkinson et al. |
| 8,104,535 | B2* | 1/2012 | Sierra .................. E21B 43/305 166/50 |
| 8,291,976 | B2 | 10/2012 | Schultz et al. |
| 8,403,038 | B2 | 3/2013 | Russell et al. |
| 8,469,107 | B2 | 6/2013 | O'Malley et al. |
| 8,485,258 | B2 | 7/2013 | Mathiesen et al. |
| 8,517,099 | B2 | 8/2013 | Mathiesen et al. |
| 8,584,762 | B2 | 11/2013 | Fripp et al. |
| 8,590,630 | B2 | 11/2013 | Mathiesen et al. |
| 8,616,290 | B2 | 12/2013 | Dykstra et al. |
| 8,657,016 | B2* | 2/2014 | Greci ...................... E21B 43/12 166/373 |
| 8,657,017 | B2 | 2/2014 | Dykstra et al. |
| 8,700,371 | B2 | 4/2014 | Thambynayagam et al. |
| 8,794,329 | B2 | 8/2014 | Holderman |
| 8,820,413 | B2 | 9/2014 | Mathiesen et al. |
| 8,910,716 | B2 | 12/2014 | Newton et al. |
| 8,991,506 | B2 | 3/2015 | Lopez et al. |
| 9,004,155 | B2 | 4/2015 | Chalker et al. |
| 9,038,649 | B2 | 5/2015 | Aakre et al. |
| 9,057,244 | B2 | 6/2015 | Øvland |
| 9,133,683 | B2 | 9/2015 | Dyer et al. |
| 9,206,669 | B2* | 12/2015 | Holderman ........... E21B 34/103 |
| 9,260,952 | B2 | 2/2016 | Fripp et al. |
| 9,279,309 | B2 | 3/2016 | Werswick et al. |
| 9,291,032 | B2 | 3/2016 | Greci |
| 9,341,049 | B2* | 5/2016 | Hailey, Jr. ................ E21B 43/12 |
| 9,353,608 | B2 | 5/2016 | Johannessen |
| 9,366,134 | B2 | 6/2016 | Walton et al. |
| 9,404,349 | B2 | 8/2016 | Zhao |
| 9,683,426 | B2* | 6/2017 | Lopez ...................... E21B 43/12 |
| 9,725,985 | B2 | 8/2017 | McNamee et al. |
| 9,745,833 | B2 | 8/2017 | Carvajal et al. |
| 9,828,838 | B2 | 11/2017 | Lopez et al. |
| 9,896,905 | B2 | 2/2018 | Noui-Mehidi |
| 10,851,626 | B2* | 12/2020 | Filippov ................. G06F 30/20 |
| 2002/0177955 | A1 | 11/2002 | Jalali et al. |
| 2010/0000740 | A1 | 1/2010 | Dale et al. |
| 2010/0299111 | A1 | 11/2010 | Dale et al. |
| 2011/0056700 | A1 | 3/2011 | Mathiesen et al. |
| 2011/0073308 | A1 | 3/2011 | Assal et al. |
| 2011/0246163 | A1 | 10/2011 | Dale et al. |
| 2011/0320047 | A1 | 12/2011 | Stone et al. |
| 2012/0016649 | A1 | 1/2012 | Thambynayagam et al. |
| 2012/0278053 | A1 | 11/2012 | Garcia et al. |
| 2016/0177674 | A1* | 6/2016 | Shetty .................... G06F 30/20 703/10 |
| 2016/0253767 | A1 | 9/2016 | Langenwalter et al. |
| 2016/0356125 | A1 | 12/2016 | Bello et al. |

OTHER PUBLICATIONS

Li et al., "Understanding the Roles of Inflow-Control Devices in Optimizing Horizontal-Well Performance," SPE Drilling & Completion (2011).*
Garcia et al., "Identifying Well Completion Applications for Passive Inflow Control Devices," SPE 124349 (2009).*
Birchenko, "Analytical Modelling of Wells with Inflow Control Devices," PhD Degree Dissertation at Institute of Petroleum Engineering Heriot-Watt University (2010).*
Sarma, P., Aziz, K. and Durlofski, L.J., Implementation of Adjoint Solution for Optimal Control of Smart Wells, Society of Petroleum Engineers, Inc. Reservoir Simulation Symposium, Jan. 31-Feb. 2, 2005, Houston, Texas, USA.
Sharma, A., Kok, J.C., Neuschaefer, R., Han, S.Y., Bieltz, T., Obvintzev, A. and Riegler, P., Integration of Dynamic Modeling of ICD Completion Design and Well Placement Technology, Society of Petroleum Engineers, Inc. Annual Technical Conference and Exhibition, Oct. 30-Nov. 2, 2011, Denver, Colorado, USA.
Su, H.-J. and Dogru, A.H., Modeling of Equalizer Production System and Smart-Well Applications in Full-Field Studies, Society of Petroleum Engineers, Inc., Reservoir Characterization and Simulation Conference, Oct. 28-30, 2011, Abu Dhabi, UAE.
Thornton, K., Jorquera, R. and Soliman, M.J., Optimization of Inflow Control Device Placement and Mechanical Conformance Decision Using a New Coupled Well-Intervention Simulator, Society of Petroleum Engineers, Inc., Nov. 11-14, 2012, Abu Dhabi, UAE.
Atkinson et al., "A semi-analytical model for predicting the flow into a wellbore completed by inflow control devices", International Journal of Engineering Science 45 (2007) pp. 350-363.
Birchenko et al., "Reduction of the horizontal well's heel-toe effect with inflow control devices", Journal of Petroleum Science and Engineering 75 (2010) pp. 244-250.
Vasily Mihalilovich Birchenko, "Analytical Modeling of Wells with Inflow with Inflow Control Devices", PhD Dissertation at Institute of Petroleum Engineering, Heriot-Watt University (2010).

* cited by examiner

ALGORITHM FOR OPTIMAL ICD CONFIGURATION USING A COUPLED WELLBORE-RESERVOIR MODEL

CROSS-REFERENCE TO RELATED APPLICATIONS

This application is a Divisional of U.S. patent application Ser. No. 14/890,581, filed on Nov. 11, 2015, which is a U.S. National Stage patent application of International Patent Application No. PCT/US2013/053263, filed on Aug. 1, 2013, the benefit of each of which is claimed and the disclosure of each of which is incorporated herein by reference in its entirety.

BACKGROUND OF THE INVENTION

1. Field of the Invention

The present disclosure relates generally to the recovery of subterranean deposits and more specifically to methods and systems for improving production of an oil well by optimizing inflow control device parameters along a horizontal wellbore using an algorithm.

2. Discussion of the Related Art

Figure 1:
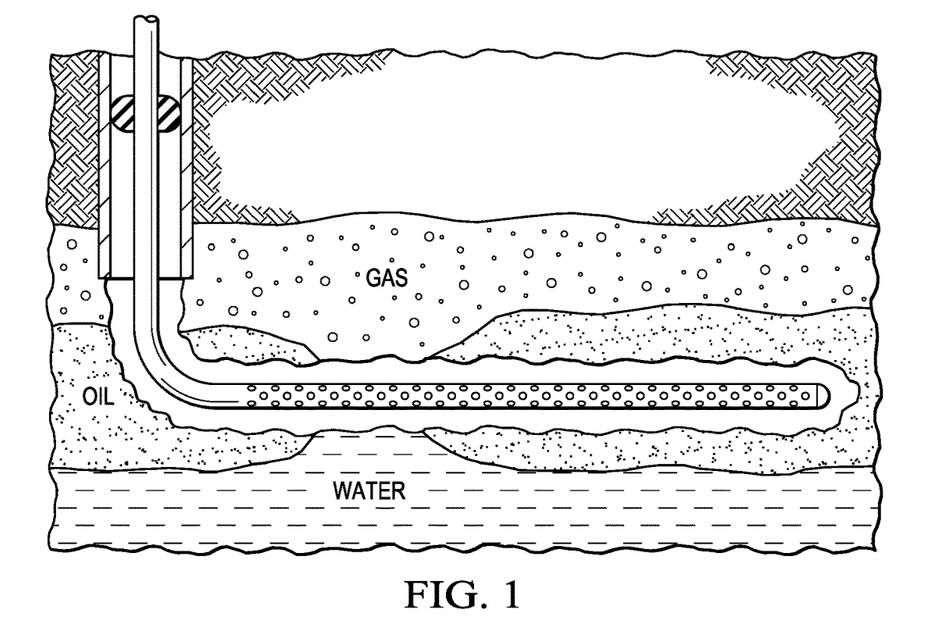
FIG. 1 is a diagram illustrating an example of a horizontal well without the use of inflow control devices in accordance with the disclosed embodiments.

Horizontal wellbores, as opposed to vertical wells, are often favored by operators for exploiting narrow, oil-bearing formations to maximize contact with the pay zone. However, as depicted in FIG. 1, these wells are subject to early water and gas coning toward the heel because of the flow's frictional pressure drops along the horizontal section. Moreover, variations in permeability can result in unbalanced inflow along the horizontal section and accelerate early water and gas breakthrough and uneven inflow downhole. These conditions can limit sweep efficiency and reduce hydrocarbon recovery from horizontal wells, leaving bypassed oil.

To combat the above problem, inflow control devices (ICDs) are used to increase performance of horizontal wells in unfavorable environments. ICDs are designed to improve completion performance and efficiency by balancing inflow throughout the length of a completion. By using ICDs, it is possible to create a homogeneous production profile that can effectively delay the water/gas breakthrough while increasing oil recovery as a consequence.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION

The disclosed embodiments include a system and method for improving production of an oil well by optimizing inflow control device parameters along a horizontal wellbore. The disclosed embodiments and advantages thereof are best understood by referring to FIGS. 1-11 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

Figure 3:
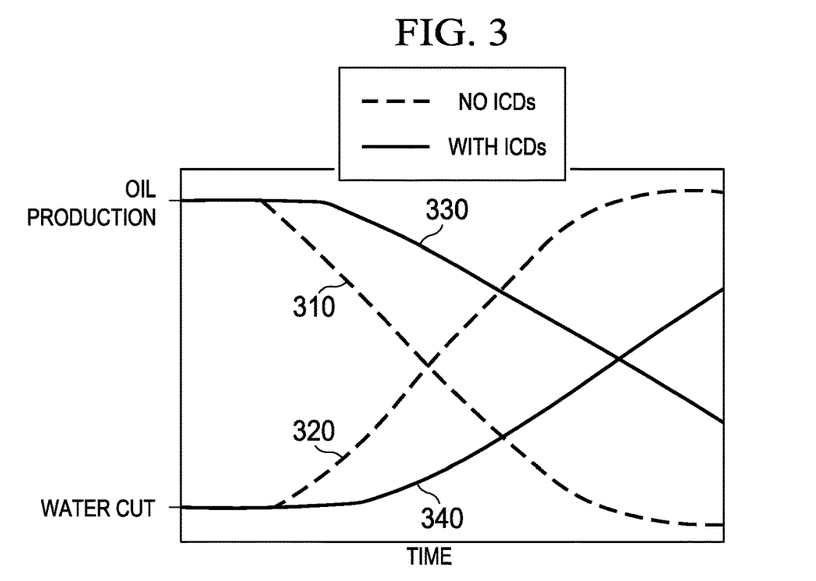
FIG. 3 is a graph that compares oil production versus water cut for a horizontal well that uses inflow control devices and a horizontal well that does not use inflow control devices in accordance with the disclosed embodiments.

As stated above, the use of inflow control devices can effectively delay the water/gas breakthrough while increasing oil recovery as a consequence. As an example, FIG. 3 depicts a graph that compares oil production versus water breakthrough for a horizontal well that uses inflow control devices and a horizontal well that does not use inflow control devices in accordance with the disclosed embodiments. In the depicted example, the dotted plots 310 and 320 respectively depict the oil production and water breakthrough of a horizontal well that does not use inflow control devices. As can be seen from the graph, the dotted plot 320 rises quickly and thus causing oil production (dotted plot 310) to decrease rapidly. In contrast, oil production plot 330 and water breakthrough plot 340 respectively indicate oil production and water breakthrough of a horizontal well that uses inflow control devices to create a balanced inflow along the horizontal section. As shown, the use of inflow control devices causes an increase in oil production by delaying the water breakthrough. Although FIG. 3 illustrates well production versus water breakthrough, similar results are achieved by delaying gas breakthrough as well.

Figure 4:
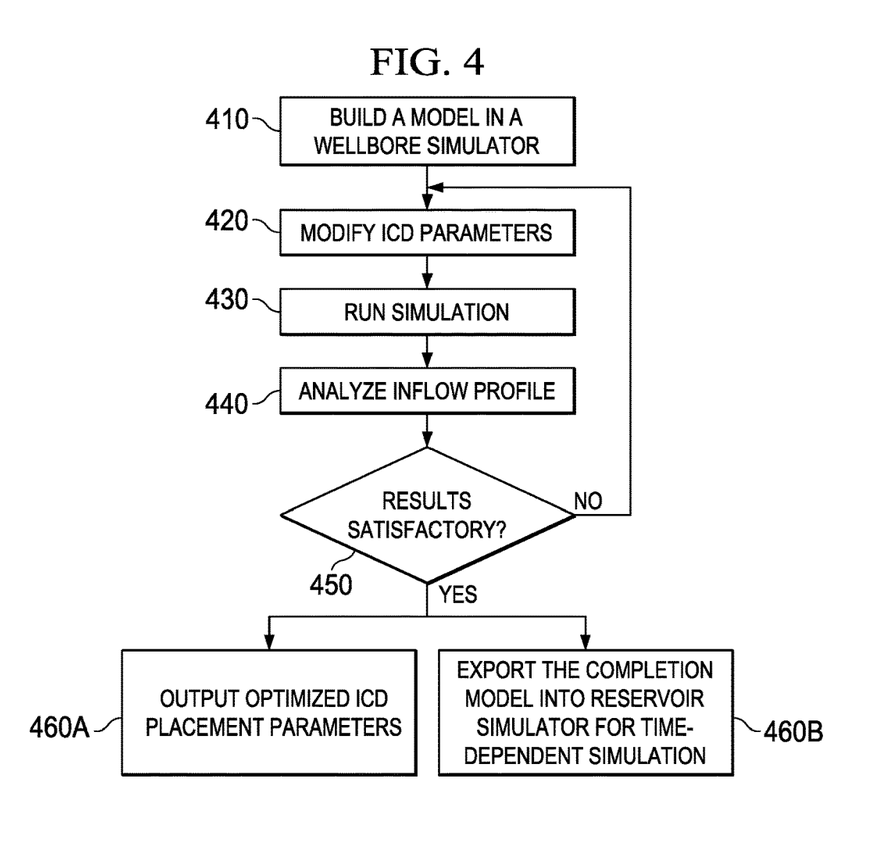
FIG. 4 is a flowchart that depicts a current process for determining inflow control device parameters along a horizontal well in accordance with the disclosed embodiments.

Now that the benefits of ICDs have been shown, the disclosed embodiments addresses the issue of how to best place and/or configure the ICDs for achieving optimal production from a horizontal well. To begin with, a current process 400 for determining inflow control device parameters along a horizontal well is depicted in FIG. 4. In the process 400, a model of the wellbore is built in a wellbore simulator at step 410. An example of a wellbore simulator is NETool® Simulation Software available from Landmark Graphics Corporation. During this step, certain well and reservoir parameters such as, but not limited to, water cut, permeability, and skin models are configured in the wellbore simulator software. At step 420, a user configures/modifies the ICD parameters in the wellbore simulator software. For example, in one embodiment, the user may manually configure the number of ICDs for a wellbore, the placement of the various ICDs along the wellbore, and the types of ICDs utilize. For example, the user may begin by configuring a uniform distribution of ICDs of the same design along the wellbore. At step 430, the user initiates the simulation based on the entered ICD parameters. The user then analyzes the inflow profile at step 440 and determines whether the results are satisfactory at step 450. If the results are not satisfactory to the user, the user can repeat the process by modifying one or more of the ICD parameters at step 420. If the results are satisfactory, in one embodiment, the results can be outputted at step 460A and used as guidance for optimal ICD placement in the field. In another embodiment, as shown in step 460B, the completed model may be exported into a reservoir simulator tool such as, but not limited to, Nexus® reservoir simulation software also available from Landmark Graphics Corporation, for performing time-dependent simulation.

Figure 5:
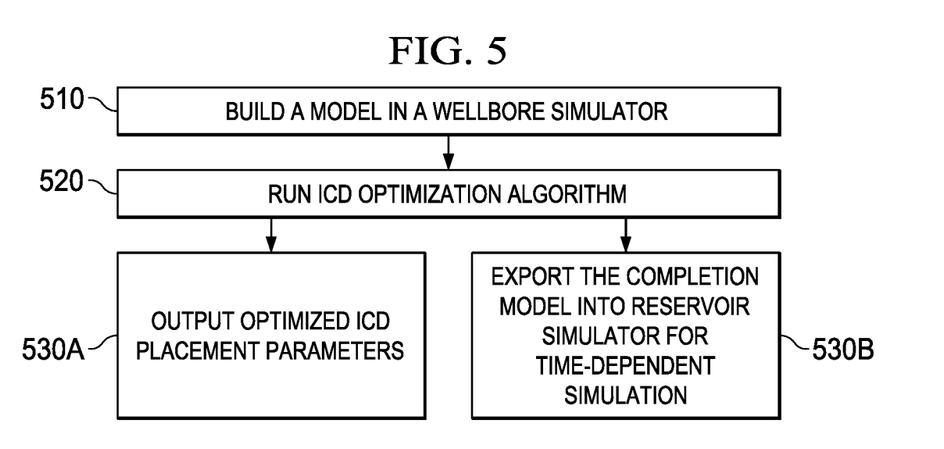
FIG. 5 is a flowchart that depicts an algorithmic process for determining inflow control device parameters along a horizontal well in accordance with the disclosed embodiments.

In contrast to the current process 400, FIG. 5 illustrates a flowchart that depicts an algorithmic process 500 for determining ICD parameters along a horizontal well for optimizing production in accordance with the disclosed embodiments. Process 500 begins by building a model of a wellbore in a wellbore simulator at step 510. Similar to the current process, during this step, certain well and reservoir parameters such as, but not limited to, water cut, permeability, and skin models are configured in the wellbore simulator software. However, instead of the current manual trial and error process, the process 500 executes an ICD optimization algorithm at step 520 to determine the optimal ICD parameters. As described above, these ICD parameters may include, but are not limited to, the number of ICDs for a wellbore, the placement of the various ICDs along the wellbore, and the types of ICDs being utilized. In one embodiment, the types of ICDs may cause varying pressure drops due to different hole densities, hole diameters, hole types, hole distance, number of holes, etc. Once the optimal ICD parameters are determined, in one embodiment, they can be outputted at step 530A and directly used for practical completion design. Alternatively, or in addition to, in some embodiments, the results may be exported as a part of the completion model for input into a reservoir simulator tool for performing time-dependent simulation as indicated at step 530B.

Figure 6:
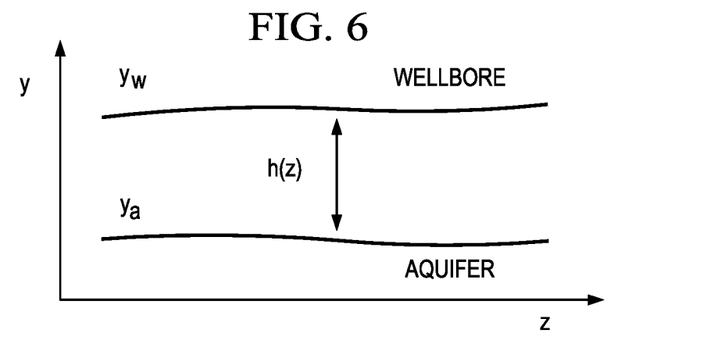
FIG. 6 depicts a sketch showing a wellbore and aquifer in the vertical plane of wellbore in accordance with the disclosed embodiments.

In order to help illustrate one approach to developing an ICD optimization algorithm, FIG. 6 depicts a sketch showing a wellbore and aquifer in the vertical plane of wellbore. In one embodiment, the ICD optimization algorithm is implemented using a simplified model of aquifer water motion near a wellbore. Typical horizontal dimensions of the wellbore (L) are of order of kilometers, while the typical distance between the wellbore and the aquifer (Lr) usually don't exceed several dozen meters. Under these conditions, in one embodiment, the horizontal transport of oil and water can be neglected and the pressure field around the wellbore is logarithmic such that in the vertical plane of wellbore, as shown in FIG. 6, the water transport to the wellbore may be described by the following equations:

$$u_y = \frac{k_w}{\mu_w}\left\{\frac{[p^B - p^e(z)]}{la\left(\frac{r_B}{r_0}\right)[y_w(z) - y]} - (\rho_w - \rho_o)g\right\} \quad \text{(Equation 1)}$$

$$v_y = \frac{\partial y}{\partial t} = \frac{1}{\gamma}u_y \quad \text{(Equation 2)}$$

where $\rho_o$ is the density of oil, $\mu_w$, $\rho_w$, and $k_w$ are the viscosity, density and formation permeability for water, $y_w$ is the vertical velocity of water, y is the vertical coordinate, g is the gravity acceleration, $\gamma$ is the formation porosity, $v_y$ is the speed of the rising water front in the plane of the wellbore, $p^B$ and $p^e$ are the pressure values at the reservoir boundary and next to the wellbore surface, and $r_B$ and $r_o$ are the radial coordinates of the reservoir boundary and the wellbore surface.

The last term in the brackets in Equation 1 accounts for water movement in the vertical pressure gradient created by the oil-bearing layer of formation. In one embodiment, Equation 1 can be integrated to yield the time required for water level to reach the wellbore:

$$t = \frac{1}{A}\left[B\ln\left(\frac{B}{B - H(z)}\right) - H(z)\right] \quad \text{(Equation 3)}$$

Where $$B = \frac{P^B - P^e(z)}{(\rho_w - \rho_o)g_y\ln\left(\frac{r_B}{r_0}\right)}; \quad \text{(Equation 4)}$$

$$A = \frac{\gamma k_w(z)(\rho_w - \rho_o)g}{\mu_w} \quad \text{(Equation 5)}$$

$$H(z) = y_w(z) - y_a(z) \quad \text{(Equation 6)}$$

where H is the wellbore-aquifer vertical distance.

The flow of oil in the wellbore is described by the following equations:

$$\frac{dV}{dz} = \frac{j}{s}; \quad j = \frac{2\pi k_o}{\mu_o}\frac{p^B - p^e(s)}{\ln\left(\frac{r_B}{r_0}\right)} \quad \text{(Equation 7)}$$

$$\frac{dp}{dz} = -\frac{f_d}{2D}\rho_0|V|V - \frac{2\rho_o V j}{s} - \rho_o g y' \quad \text{(Equation 8)}$$

$$j^2 = \frac{f(z)}{K}[p^e(z) - p^i(z)] \quad \text{(Equation 9)}$$

where z is the horizontal coordinate,

V and p' are the average flow velocity and pressure,

S and D are the wellbore cross-section area and diameter, j is the volumetric influx of oil per unit length of wellbore, $\mu_o$, $\rho_o$, and $k_o$ are the viscosity, density and formation permeability for oil, and $f_d$ is the Darcy friction coefficient.

Equation 7 is the continuity equation. Equation 8 is the momentum balance equation. Equation 9 describes the dependence of the influx of oil on the pressure difference between the flow in wellbore and the formation.

In one embodiment, the function $f(z)$ can be assumed equal to unity for some standard placement of ICDs, characterized by the flow resistance coefficient K In the simplest case, when ICDs include holes with diameters $D_{or}$, situated at distances $L_{or}$ from each other, the coefficient K equals to:

$$K = \frac{8 p_o L_{or}^2(0)}{\pi^2 D_{or}^4(0)} \quad \text{(Equation 10)}$$

and $$f(z) = \frac{L_{or}^2(z)\ D_{or}^2(0)}{L_{or}^2(0)\ D_{or}^2(z)} \quad \text{(Equation 11)}$$

The longitudinal variation of hole diameter or hole spacing can be accounted for in the model by using a non-constant function $f(z)$, which is referenced herein as the ICD distribution function. Thus, increasing the value of $f(z)$, based on the above equations, would result in a pressure drop across the ICD wall and an increase in influx of reservoir fluids. However if the pressure difference between the reservoir and the wellbore is kept constant, the water breakthrough time (t), according to Equation 3, will decrease. Thus, by varying the ICD efficiency function $f(z)$, the disclosed embodiments are able to control the breakthrough time of water (t).

Figure 2:
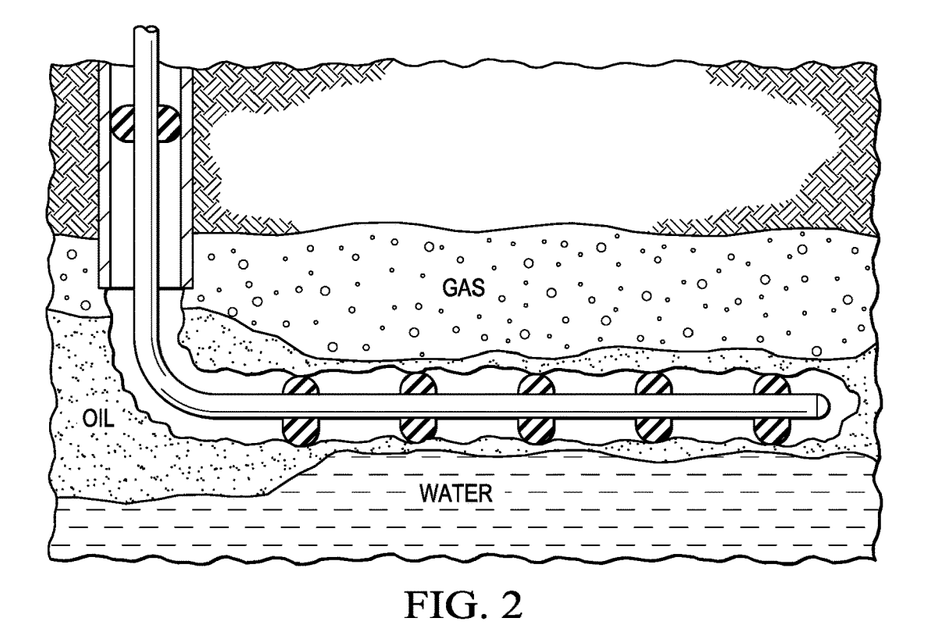
FIG. 2 is a diagram illustrating an example of a horizontal well that uses inflow control devices in accordance with the disclosed embodiments.

Therefore, a desire of the disclosed embodiments is to determine an optimal value for the ICD efficiency function $f(z)$ such that the water breakthrough time is the same for all points of the wellbore, as illustrated in FIG. 2, thereby reducing a possibility of water breakthrough. The value of $f(z)$ indicates the amount of oil that can go through an orifice for a certain pressure drop between the interior of the wellbore and the reservoir at a certain point (z) along the wellbore.

Figure 7:
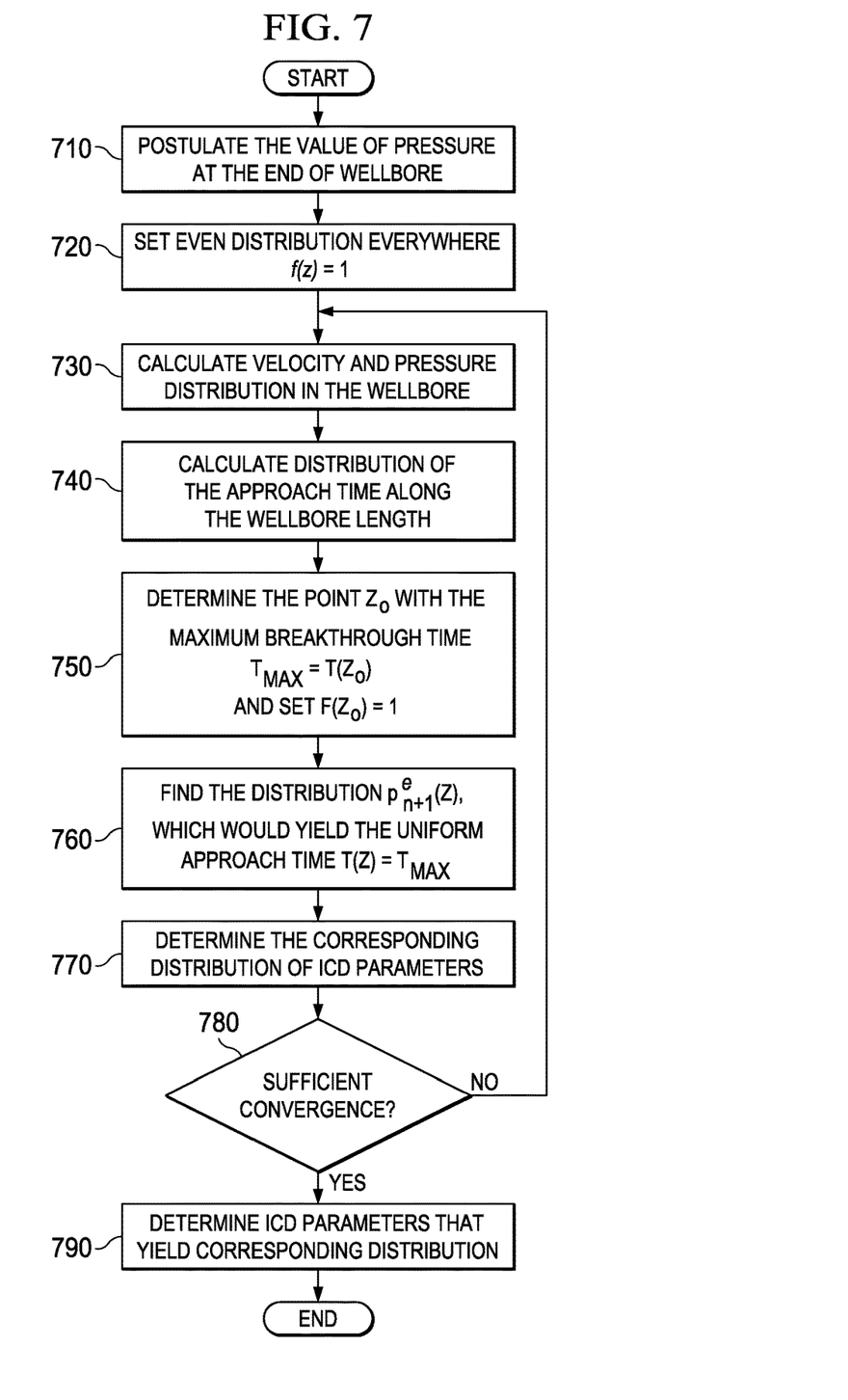
FIG. 7 is a flowchart that depicts an inflow control device optimization algorithm in accordance with the disclosed embodiments.

One embodiment for determining an optimal value for the ICD efficiency function $f(z)$ is presented in FIG. 7, which depicts an ICD optimization algorithm 700 in accordance with the disclosed embodiments. The ICD optimization algorithm 700 begins at step 710 by postulating the value of pressure at the end of the wellbore ($p^i$). At step 720, the process assumes uniform ICD distribution everywhere along the wellbore (e.g., it sets $f(z)=1$). The process then calculates velocity and pressure distribution in the wellbore at step 730. For instance, in one embodiment, the process calculates profiles of pressure inside the wellbore ($p^I$), pressure at the boundary of the reservoir ($p^B$), and velocity (e.g., the flow density across the wall and flow of oil through these ICDs).

At step 740, the process calculates distribution of the breakthrough time along the wellbore length as indicated above in equation 3. The process, at step 750, determines a point along the wellbore ($z_0$) that has the maximum breakthrough time ($t_{max}$) (i.e., $t(z_0)$ equals ($t_{max}$)) and sets the ICD distribution function at that location $f(z_0)$ to 1. In the following iterations, the value of $f(z_0)$ does not change, which implies that the ICD properties such as the hole diameter and spacing at this one particular location are fixed.

At the (n+1)th iteration of the process, at step 760, using Equations 3 through 6, the process determines the distribution of pressure outside the wellbore ($p^e_{n+1}(z)$), which would yield the uniform approach time $t(z)=t_{max}$. At step 770, using the solution equations 7 through 9, obtained at step 730, the process determines the corresponding ICD distribution function value at this iteration: $f_{n+1}(z)=j_n^2 k[p_{n+1}^e(z)-p_n^i(z)]^{-1}$.

At step 780, the process determines whether the flow distribution sufficiently convergences $|f_{n+1}(z)-f_n(z)|<\varepsilon$. $\varepsilon$ is a value that indicates good convergence of the algorithm.

For example, in one embodiment, based on numerical tests, a value of $\varepsilon=10^{-6}$ may be used as indicative of good convergence of the algorithm. If the process determines at step 780 that the flow distribution does not sufficiently converge, the process performs another iteration of the algorithm by returning to step 730, but instead of assuming even flow everywhere as initially set in step 720, the subsequent iteration utilizes the latest determined $f(z)$ flow distribution from the previous iteration of the algorithm as $f(z)$ will no longer be 1 (i.e., even distribution) as the value of $p^e$ (i.e., pressure outside of the wellbore) has changed. In one embodiment, the process may repeat several iterations of the algorithm before the flow distribution sufficiently convergences at step 780. However, in certain embodiments, the algorithm converges quickly (e.g., within five iterations). Once the process determines that the ICD distribution function $f(z)$ sufficiently converges, the process determines the ICD parameters (e.g., hole density/diameter, type of holes, number of holes, and hole spacing/distance) that would yield this distribution using Equation 11.

Accordingly, the disclosed embodiments include a system and method that is configured to determine the optimal ICD parameters utilizing an algorithmic process as opposed to a manual trial and error process.

Figure 8:
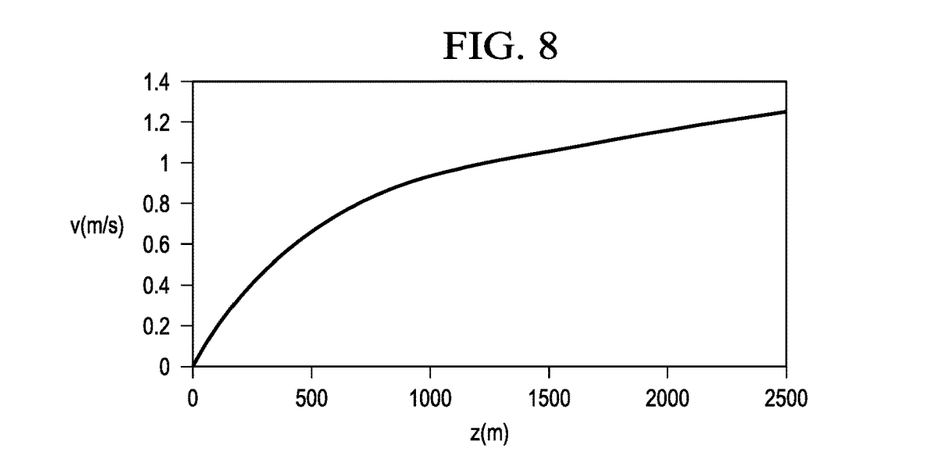
FIG. 8 is a graph that illustrates an example of a calculated velocity profile in a wellbore in accordance with the disclosed embodiments.

Additionally, in some embodiments, the disclosed ICD optimization algorithm may be applied to a numerical model developed based on a finite difference solution to the above equations. The model accounts for variable wellbore-aquifer distance, and water, oil and formation properties. Vertical-horizontal anisotropy of permeability can be accounted by using effective permeability. For instance, to illustrate the suggested algorithm and numerical model, in one embodiment, consider an example of a horizontal well having a diameter 0.15 m, a length 2500 m, and is situated 3 m above a flat aquifer. The viscosities of oil and water are set to $10^{-2}$ $and$ $10^{-3}$ Pas, respectively, while the permeability for both liquids were set to be 0.5 Darcy. Based on the above conditions, numerical trials using the described numerical model and disclosed ICD optimization algorithm demonstrated excellent convergence and required only several runs to achieve a desired accuracy of the results. For example, FIG. 8 illustrates the velocity profile inside the wellbore, with z coordinate starting at the toe of the wellbore.

Figure 9:
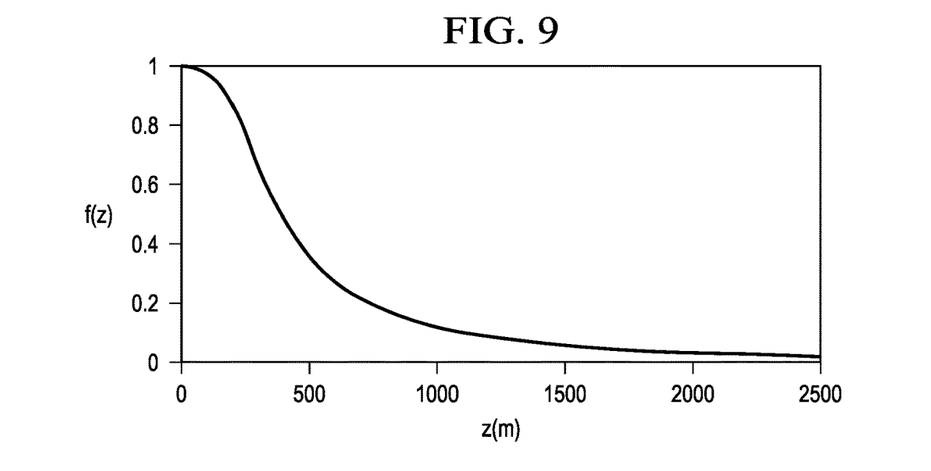
FIG. 9 is a graph that illustrates an example a calculated ICD distribution function along a wellbore in accordance with the disclosed embodiments.
Figure 10:
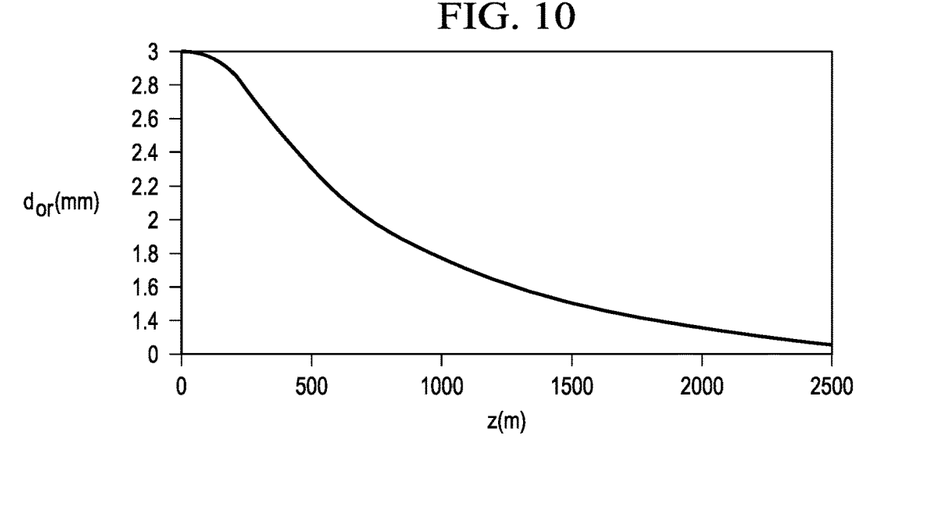
FIG. 10 is a graph that illustrates an example a variation of the ICD hole diameter corresponding to the ICD distribution function of FIG. 9 in accordance with the disclosed embodiments.

The calculated ICD distribution function $f(z)$ resulting from the application of the disclosed ICD optimization algorithm is illustrated in FIG. 9. According to Equations 7 through 11, the results illustrated in FIG. 9 can be realized, for example, by varying hole-to-hole distance $L_{or}$ or by changing the diameter of the holes $D_{or}$ when the distance $L_{or}$ is fixed. For example, if the distance $L_{or}$ is fixed to 12 m, the variation of the ICD distribution function shown in FIG. 9 can be achieved by varying the hole diameter as shown in FIG. 10. In other embodiments, the change of the ICD distribution function can be achieved by varying both hole diameter, ICD distance $L_{or}$, as well as by placement of ICDs of various designs in different parts of the well.

Figure 11:
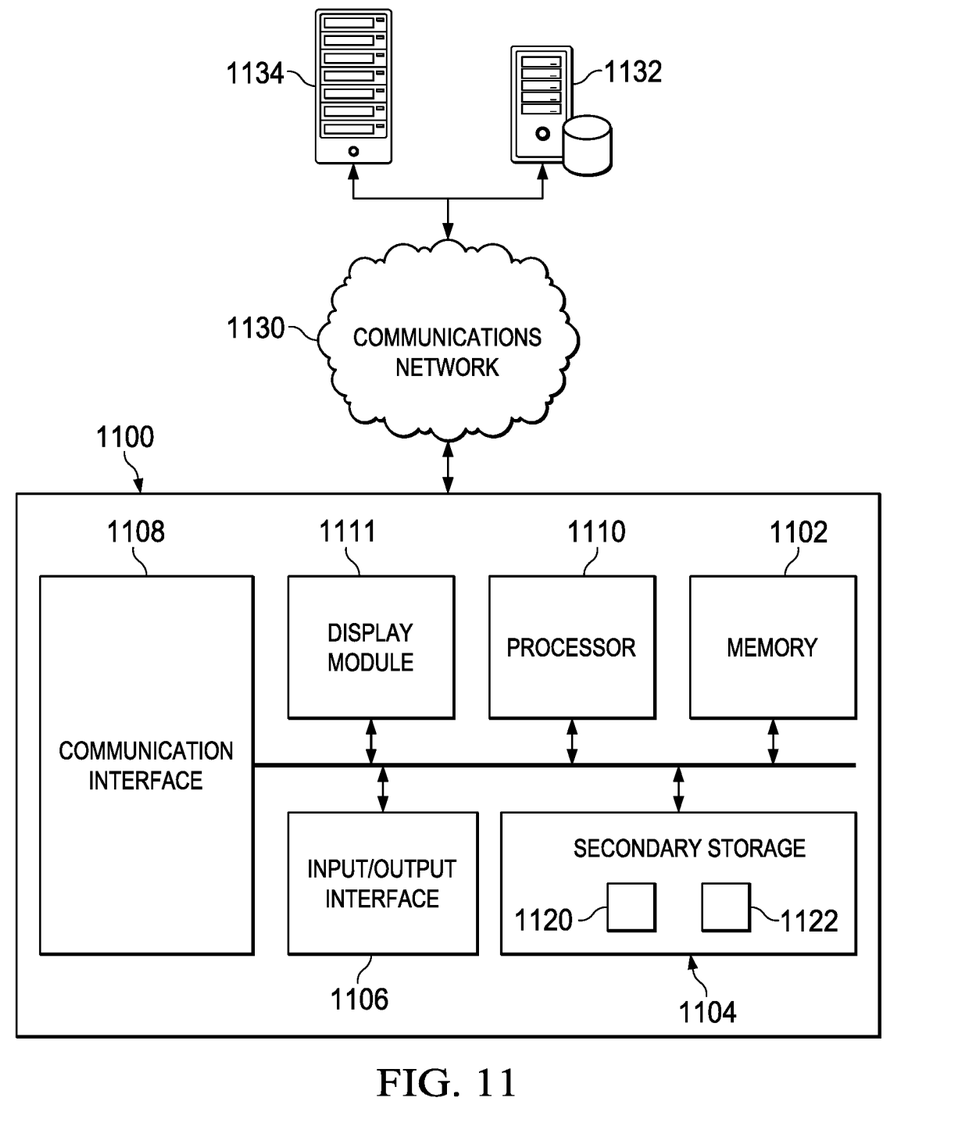
FIG. 11 is a block diagram illustrating one embodiment of a system for implementing the disclosed embodiments.

Referring now to FIG. 11, a block diagram illustrating one embodiment of a system 1100 for implementing the features and functions of the disclosed embodiments is presented. The system 1100 may be any type of computing device including, but not limited to, a desktop computer, a laptop, a server, a tablet, and a mobile device. The system 1100 includes, among other components, a processor 1100, main memory 1102, secondary storage unit 1104, an input/output interface module 1106, and a communication interface module 1108.

The processor 1100 may be any type or any number of single core or multi-core processors capable of executing instructions for performing the features and functions of the disclosed embodiments. The input/output interface module 1106 enables the system 1100 to receive user input (e.g., from a keyboard and mouse) and output information to one or more devices such as, but not limited to, printers, external data storage devices, and audio speakers. The system 1100 may optionally include a separate display module 1110 to enable information to be displayed on an integrated or external display device. For instance, the display module 1110 may include instructions or hardware (e.g., a graphics card or chip) for providing enhanced graphics, touchscreen, and/or multi-touch functionalities associated with one or more display devices.

Main memory 1102 is volatile memory that stores currently executing instructions/data or instructions/data that are prefetched for execution. The secondary storage unit 1104 is non-volatile memory for storing persistent data. The secondary storage unit 1104 may be or include any type of data storage component such as a hard drive, a flash drive, or a memory card. In one embodiment, the secondary storage unit 1104 stores the computer executable code/instructions and other relevant data for enabling a user to perform the features and functions of the disclosed embodiments.

For example, in accordance with the disclosed embodiments, the secondary storage unit 1104 may permanently store the executable code/instructions of the above-described ICD optimization algorithm 1120. The instructions associated with the ICD optimization algorithm 1120 are then loaded from the secondary storage unit 1104 to main memory 1102 during execution by the processor 1100 for performing the disclosed embodiments. In addition, the secondary storage unit 1104 may store other executable code/instructions and data 1122 such as, but not limited to, a wellbore simulator application and/or a reservoir simulation application for use with the disclosed embodiments.

The communication interface module 1108 enables the system 1100 to communicate with the communications network 1130. For example, the network interface module 1108 may include a network interface card and/or a wireless transceiver for enabling the system 1100 to send and receive data through the communications network 1130 and/or directly with other devices.

The communications network 1130 may be any type of network including a combination of one or more of the following networks: a wide area network, a local area network, one or more private networks, the Internet, a telephone network such as the public switched telephone network (PSTN), one or more cellular networks, and wireless data networks. The communications network 1130 may include a plurality of network nodes (not depicted) such as routers, network access points/gateways, switches, DNS servers, proxy servers, and other network nodes for assisting in routing of data/communications between devices.

For example, in one embodiment, the system 1100 may interact with one or more servers 1134 or databases 1132 for performing the features of the disclosed embodiments. For instance, the system 1100 may query the database 1132 for well log information for creating a wellbore model in accordance with the disclosed embodiments. Further, in certain embodiments, the system 1100 may act as a server system for one or more client devices or a peer system for peer to peer communications or parallel processing with one or more devices/computing systems (e.g., clusters, grids).

Thus, the disclosed embodiments provide a method for determining the optimal ICD parameters for a given wellbore utilizing an efficient algorithmic process. For example, in certain embodiments, determining the optimal ICD parameters may include determining the placement of the ICDs along the wellbore, the diameters of the ICDs, and/or the types of ICDs. The disclosed embodiments may be applied to coupled wellbore-reservoir simulations of various complexity levels.

In addition, in certain embodiments, a simple numerical model implementing the embodiments of the disclosed algorithm can be used for calculating a starting condition for higher level coupled wellbore-reservoir models for optimization of the ICD parameters. The suggested numerical model can provide a very good initial guess for CPU-expensive simulations involving detailed 3D models. On another hand, it is elaborate enough to account for many physical phenomena, and reservoir conditions, varying along the wellbore. It can be easily expanded to include the thermal effects or the formation vertical-horizontal anisotropy by introducing the effective permeability.

Additionally, the disclosed ICD optimization algorithm can be used not only for optimizing ICD parameters for preventing wellbore flooding near aquifers, but also to optimize the ICDs in respect to gas flooding from the layer above the wellbore. For instance, in one embodiment, the switch from the aquifer to the gas mode in the algorithm is performed by replacing the water physical parameters with those of gas, with exception of the water density, which is replaced by the density difference: $\rho_w - \rho_o -> \rho_o - \rho_{gas}$. All other elements of the algorithm would remain the same.

While specific details about the above embodiments have been described, the above hardware and software descriptions are intended merely as example embodiments and are not intended to limit the structure or implementation of the disclosed embodiments. For instance, although many other internal components of the system 1100 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of maufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In summary, the disclosed embodiments include a method, apparatus, and computer program product for improving production of an oil well by optimizing inflow control device parameters along a horizontal wellbore. In addition to the embodiments described above, many examples of specific combinations are within the scope of the disclosure, some of which are detailed below.

Example 1. A computer implemented method for improving production of an oil well, the method comprising: generating a model of a wellbore in a wellbore simulator; and executing an algorithm that determines optimal parameters of inflow control devices (ICD) along a horizontal portion of the wellbore, wherein the determined optimal parameters of the inflow control devices yields a substantially uniform approach of at least one of water and gas along the horizontal portion of the wellbore.

In certain embodiments, the embodiment of Example 1 may be modified to include exporting the model into reservoir simulator for time-dependent simulation. In another embodiment of Example 1, the method includes initializing a fixed pressure value at a toe end of the wellbore and executing a loop of instructions until a flow distribution sufficiently converges. In some embodiments, the loop initially begins with an even distribution along the horizontal portion of the wellbore and uses the flow distribution results from a prior loop for a subsequent loop. Example 1 may further include instructions for determining a point along the horizontal portion of the wellbore that has a maximum approach time. Still, in some embodiments of Example 1, the computer implemented method includes instructions for determining a pressure distribution along the horizontal portion of the wellbore that yields a uniform breakthrough time.

The determined optimal parameters of the inflow control devices in Example 1 may vary a diameter of holes of the inflow control devices along the horizontal portion of the wellbore and/or a distance between the inflow control devices along the horizontal portion of the wellbore. Additionally, embodiments of the computer implemented method of Example 1 as described above may be applied to a numerical model.

Example 2. A system, comprising: at least one processor; and at least one memory coupled to the at least one processor and storing computer executable instructions for improving production of an oil well, the computer executable instructions comprises instructions for: generating a model of a wellbore in a wellbore simulator; and executing an algorithm that determines optimal parameters of inflow control devices (ICD) along a horizontal portion of the wellbore, wherein the determined optimal parameters of the inflow control devices yields a substantially uniform approach of at least one of water and gas along the horizontal portion of the wellbore.

Example 2.1. The system of Example 2, wherein the algorithm includes one or more of the following instruction: 1) instructions for initializing a fixed pressure value at a toe end of the wellbore; 2) instructions for executing a loop of instructions until a flow distribution sufficiently converges, wherein the loop initially begins with an even distribution along the horizontal portion of the wellbore and uses the flow distribution results from a prior loop for a subsequent loop; 3) instructions for determining a point along the horizontal portion of the wellbore that has a maximum approach time; and 4) instructions for determining a pressure distribution along the horizontal portion of the wellbore that yields a uniform approach time.

Example 3. A non-transitory computer readable medium comprising computer executable instructions for improving well production, the computer executable instructions when executed causes one or more machines to perform operations comprising: generating a model of a wellbore in a wellbore simulator; and executing an algorithm that determines optimal parameters of inflow control devices (ICD) along a horizontal portion of the wellbore, wherein the determined optimal parameters of the inflow control devices yields a substantially uniform approach of at least one of water and gas along the horizontal portion of the wellbore.

Example 3.1. The non-transitory computer readable medium of Example 3, wherein the algorithm includes instructions for executing a loop of instructions until a flow distribution sufficiently converges, wherein the loop initially begins with an even distribution along the horizontal portion of the wellbore and uses the flow distribution results from a prior loop for a subsequent loop, and wherein the loop includes instructions for determining a point along the horizontal portion of the wellbore that has a maximum approach time; determining a pressure distribution along the horizontal portion of the wellbore that yields a uniform approach time; determining the flow distribution corresponding to the determined pressure distribution; and determining whether the flow distribution sufficiently converges.

The above specific example embodiments are not intended to limit the scope of the claims. The example embodiments may be modified by including, excluding, or combining one or more features or functions described in the disclosure.

In addition, as used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to explain the principles of the invention and the practical application, and to enable others of ordinary skill in the art to understand the invention for various embodiments with various modifications as are suited to the particular use contemplated. The scope of the claims is intended to broadly cover the disclosed embodiments and any such modification.

The invention claimed is:

1. A computer implemented method for improving production of an oil well, the method comprising:
   generating a wellbore model representing an actual wellbore within a reservoir formation;
   initializing an inflow control device (ICD) distribution function associated with the generated wellbore model according to a uniform ICD distribution, the ICD distribution function representing inflow control devices at different points along a portion of the generated wellbore model corresponding to a horizontal portion of the actual wellbore;

simulating a flow of reservoir fluid from the reservoir formation into the portion of the generated wellbore model corresponding to the horizontal portion of the actual wellbore via the inflow control devices represented by the ICD distribution function, wherein the simulation of the flow of the reservoir fluid is performed over a plurality of iterations until it is determined that a distribution of the simulated flow of the reservoir fluid yields a uniform approach time for the reservoir fluid across all of the different points along the portion of the generated wellbore model corresponding to the horizontal portion of the actual wellbore, and wherein each iteration of the plurality of iterations comprises:

modifying the ICD distribution function based on a determined point along a portion of the generated model, wherein the determined point represents a point of a maximum approach time;

determining one or more optimal parameters for actual inflow control devices along the horizontal portion of the actual wellbore to yield the uniform approach time of the reservoir fluid during a production operation within the reservoir formation, based on the ICD distribution function as modified at the end of the plurality of iterations of the simulation; and using the one or more optimal parameters to configure the actual inflow control devices to control an actual flow of the reservoir fluid from the reservoir formation into the actual wellbore during the production operation.

2. The computer implemented method of claim 1, further comprising exporting the generated wellbore model into a reservoir simulator for time-dependent simulation.

3. The computer implemented method of claim 1, wherein the method further comprises initializing a pressure value at a point in the generated wellbore model corresponding to a toe end of the actual wellbore.

4. The computer implemented method of claim 1, wherein the method further comprises adjusting the one or more optimal parameters of the inflow control devices as represented in the generated wellbore model over the plurality of iterations of the simulation until a distribution of the reservoir fluid along the portion of the generated wellbore model corresponding to the horizontal portion of the actual wellbore sufficiently converges during the plurality of iterations of the simulation.

5. The computer implemented method of claim 1, wherein the method further comprises determining which of the different points along the portion of the generated wellbore model corresponding to the horizontal portion of the actual wellbore that has a maximum approach time.

6. The computer implemented method of claim 1, wherein the method further comprises determining a pressure distribution along the portion of the generated wellbore model corresponding to the horizontal portion of the actual wellbore that yields the uniform approach time.

7. The computer implemented method of claim 1, wherein the determined one or more optimal parameters of the inflow control devices varies a diameter of holes of the inflow control devices along the horizontal portion of the actual wellbore.

8. The computer implemented method of claim 1, wherein the determined one or more optimal parameters of the inflow control devices varies a distance between the inflow control devices along the horizontal portion of the actual wellbore.

9. The computer implemented method of claim 1, wherein the determined one or more optimal parameters of the inflow control devices varies a diameter of holes of the inflow control devices and a distance between the inflow control devices along the horizontal portion of the actual wellbore.

10. The computer implemented method of claim 1, wherein the method further comprises application to a numerical model.

11. A non-transitory computer readable medium comprising computer executable instructions, which, when executed by a computer causes the computer to perform a plurality of functions, including functions to:

generate a wellbore model representing an actual wellbore within a reservoir formation;

initialize an inflow control device (ICD) distribution function associated with the generated wellbore model according to a uniform ICD distribution, the ICD distribution function representing inflow control devices at different points along a portion of the generated wellbore model corresponding to a horizontal portion of the actual wellbore;

simulate a flow of reservoir fluid from the reservoir formation into the portion of the generated wellbore model corresponding to the horizontal portion of the actual wellbore via the inflow control devices represented by the ICD distribution function, wherein the simulation of the flow of the reservoir fluid is performed over a plurality of iterations until it is determined that a distribution of the simulated flow of the reservoir fluid yields a uniform approach time for the reservoir fluid across all of the different points along the portion of the generated wellbore model corresponding to the horizontal portion of the actual wellbore, and wherein the functions at each iteration of the plurality of iterations include functions to:

modify the ICD distribution function based on a determined point along a portion of the generated model, wherein the determined point represents a point of a maximum approach time;

determine one or more optimal parameters for actual inflow control devices along the horizontal portion of the actual wellbore to yield the uniform approach time of the reservoir fluid during a production operation within the reservoir formation, based on the ICD distribution function as modified at the end of the plurality of iterations of the simulation; and use the one or more optimal parameters to configure the actual inflow control devices to control an actual flow of reservoir fluid from the reservoir formation into the actual wellbore during the production operation.

12. The non-transitory computer readable medium of claim 11, wherein the functions performed by the computer further comprise functions to:

determine a pressure distribution that yields the uniform approach time of the simulated reservoir fluid flow along the portion of the generated wellbore model corresponding to the horizontal portion of an actual wellbore, and determine an ICD distribution along the horizontal portion of the actual wellbore corresponding to the determined pressure distribution along the portion of the generated wellbore model.

* * * * *